United States Patent
Liao et al.

(10) Patent No.: US 7,244,901 B1
(45) Date of Patent: Jul. 17, 2007

(54) CAPACITIVE TOUCH PANEL

(75) Inventors: Peter Liao, Banciao (TW); Chia-Yen Li, Banciao (TW); Fu-Tien Ku, Banciao (TW)

(73) Assignee: Danotech Co., Ltd., Banciao (TW)

( * ) Notice: Subject to any disclaimer, the term of this patent is extended or adjusted under 35 U.S.C. 154(b) by 0 days.

(21) Appl. No.: 11/402,247

(22) Filed: Apr. 11, 2006

(51) Int. Cl.
*H03K 17/975* (2006.01)

(52) U.S. Cl. .................. 200/600; 345/173; 341/22; 349/12

(58) Field of Classification Search ............... 200/600; 345/173–175, 177; 341/22–25; 349/12, 349/130
See application file for complete search history.

(56) References Cited

U.S. PATENT DOCUMENTS

| | | | |
|---|---|---|---|
| 3,307,240 A | * | 3/1967 | Ginsbach et al. ........... 438/140 |
| 4,371,746 A | | 2/1983 | Pepper, Jr. |
| 4,822,957 A | | 4/1989 | Talmage, Jr. et al. |
| 5,846,110 A | * | 12/1998 | Kanagu et al. ............... 445/25 |
| 6,265,682 B1 | * | 7/2001 | Lee ............................. 200/600 |
| 6,677,542 B2 | * | 1/2004 | Katakami ..................... 200/5 A |
| 6,781,579 B2 | | 8/2004 | Huang et al. |
| 6,894,682 B2 | * | 5/2005 | Nakajima et al. ........... 345/173 |
| 6,963,040 B1 | * | 11/2005 | Urman ........................ 200/310 |

* cited by examiner

*Primary Examiner*—Richard K. Lee
(74) *Attorney, Agent, or Firm*—Frenkel & Associates, P.C.

(57) ABSTRACT

The present invention discloses a capacitive touch panel, which comprises: an insulation substrate; an electrically-conductive layer, installed on the insulation substrate; and multiple electrically-conductive segments, installed on the perimeter of the electrically-conductive layer. The present invention improves the distribution characteristics of the electric field neighboring the frame of a touch panel via providing at least one chamfer for one end of each electrically-conductive segment. Thereby, the distribution of the electric field lines neighboring the frame can be smooth and uniform. Thus, the accuracy and the usable area of the touch panel are promoted.

5 Claims, 10 Drawing Sheets

CAPACITIVE TOUCH PANEL

FIELD OF THE INVENTION

The present invention relates to a touch panel structure, particularly to a structure of a capacitive touch panel.

BACKGROUND OF THE INVENTION

Recently, owing to the emergence of IA (Information Appliance) products, touch panels have gradually replaced the traditional human-machine interfaces, such as keyboards and mice. As users can operate the touch panel easily and conveniently, the application of touch panels has expanded to the various fields, such as portable communication products and information products (e.g. PDA), banking/business systems, medical registry systems, factory-monitoring systems, public information-guide systems, and computer-aided instruction systems.

According to sensing methods, touch panels may be divided into capacitive types, sonic types, infrared types, resistive types, and magnetism-induction types. Among them, the capacitive types are applied to large-size touch panels. A capacitive touch panel comprises: an insulation substrate; an electrically-conductive layer, coated on the insulation substrate; and multiple electrically-conductive segments, printed on the electrically-conductive layer, and creating X-direction and Y-direction electrical fields. The contact of a finger or a pen point on a capacitive touch panel will create a capacitance change, which will further induce a current. According to the induced current, the X-coordinate and the Y-coordinate of the contact point can be calculated. Then, the instruction corresponding to the contact point is sent out.

U.S. Pat. No. 4,822,957 and U.S. Pat. No. 4,371,746 disclosed a touch panel; however, the electrical-field linearity thereof is unsatisfactory. The quality of the electrical-field linearity will influence the correctness of the coordinate identification of a touch panel. To solve the abovementioned problem, a U.S. Pat. No. 6,781,579 discloses a touch panel, wherein multiple rows of electrically-conductive segments are installed, and the number of the electrically-conductive segments is uneven and inward-decreases gradually. Thereby, the electrical-field linearity becomes better, and the area occupied by the electrically-conductive segments is reduced, and the usable area of the touch panel is increased.

The charge distribution of a conductor correlates with the curvature of its surface. The larger the curvature, the higher the charge density; the smaller the curvature, the lower the charge density. The abovementioned invention may improve the electrical-field linearity. However, as shown in FIG. 1, the ends of its electrically-conductive segments are rectangular, which causes the charge distribution neighboring the segment terminals to be uneven. Thus, as shown in FIG. 4B, the configuration of the electric field lines neighboring the frame will change drastically, and the electrical-field linearity neighboring the frame becomes lower, and the usable area of the touch panel is reduced.

SUMMARY OF THE INVENTION

The present invention proposes a capacitive touch panel, which has a superior electrical-field linearity.

To achieve the abovementioned objective, one preferred embodiment of the present invention discloses a capacitive touch panel, which comprises: an insulation substrate; an electrically-conductive layer, disposed on the insulation substrate; and multiple electrically-conductive segments, disposed on the perimeter of the electrically-conductive layer, wherein one end of one each electrically-conductive segment has a chamfer with its center positioned at the centerline along the major axis of the electrically-conductive segment, and the curvature radius of the chamfer ranges from R/2 to 10R (R is the width of the electrically-conductive segment). The smooth contour of the chamfer makes uniform the charge distribution at the segment end. Thus, the area of electrical-field linearity is enlarged, and the accuracy and the usable area of the touch panel is increased.

According to another embodiment of the present invention, the end of the electrically-conductive segment has multiple chamfers with the curvature radius of the chamfer ranging from R/10 to 10R (R is the width of the electrically-conductive segment). The positions of the chamfers are preferably symmetric to the centerline along the major axis of the electrically-conductive segment. Thereby, the electric field lines can also be uniformly distributed.

DETAILED DESCRIPTION OF THE PREFERRED EMBODIMENTS

Figure 1:
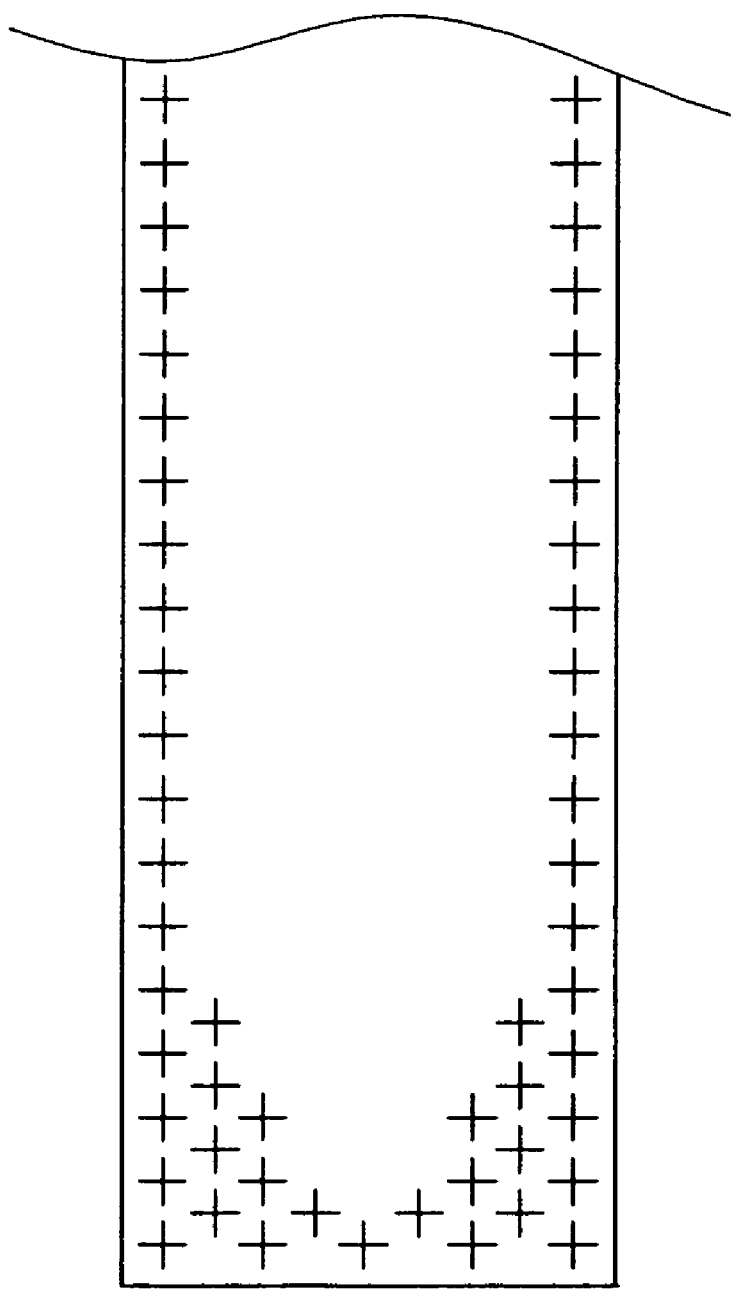
FIG. 1 is a diagram schematically showing the distribution of the charges at one end of the electrically-conductive segment of the conventional technology.
Figure 2:
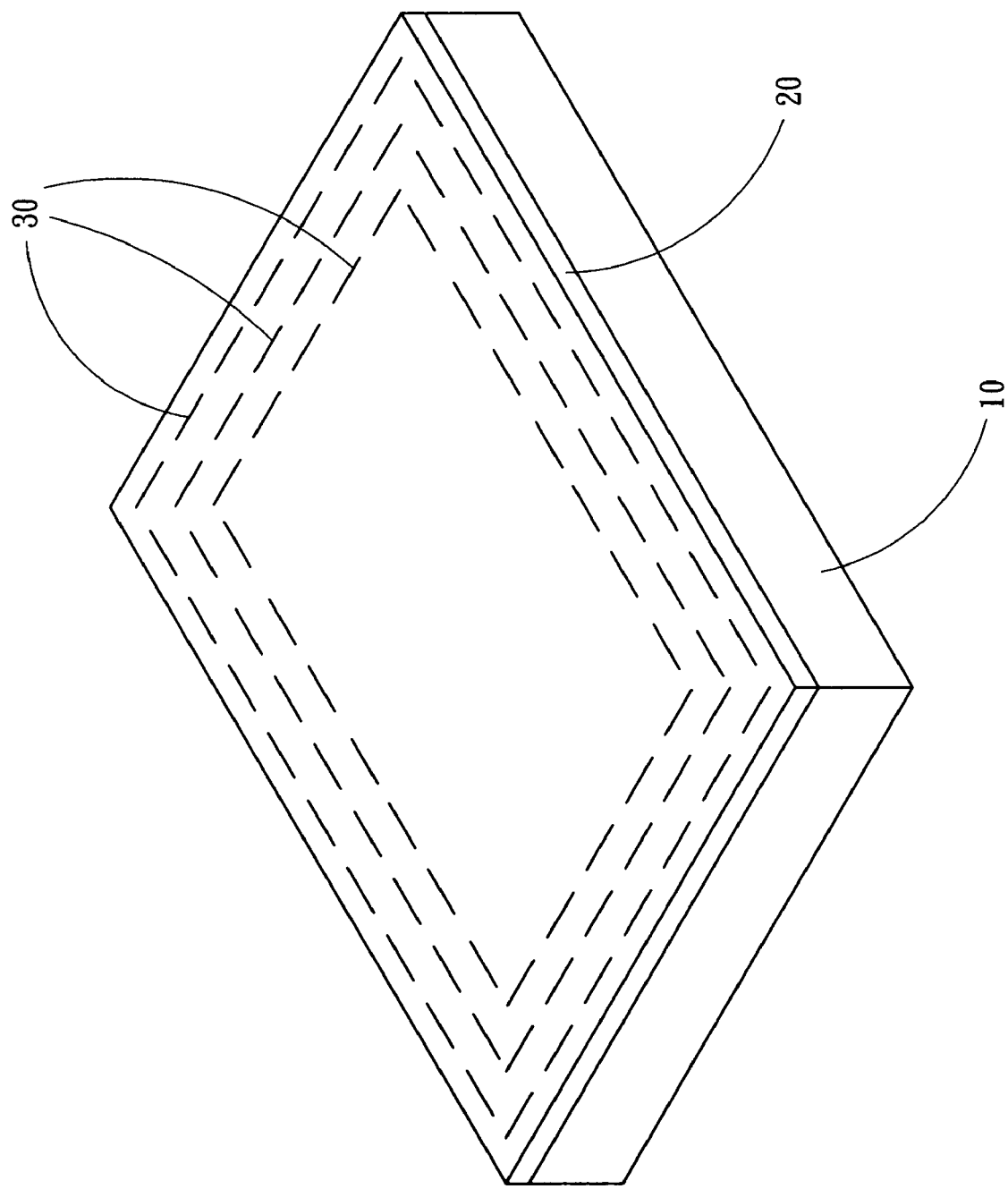
FIG. 2 is a diagram schematically showing the structure of a capacitive touch panel according to one embodiment of the present invention.

Refer to FIG. 2 for a preferred embodiment of the capacitive touch panel according to the present invention. In this embodiment, the capacitive touch panel comprises: an insulation substrate 10, an electrically-conductive layer 20, and multiple electrically-conductive segments 30.

In this embodiment, the insulation substrate 10 is made of glass, and the electrically-conductive layer 20 is an ATO (Antimony Tin Oxide) film. An electrically-conductive material, such as electrically-conductive silver ink, is used to form multiple separate electrically-conductive segments 30 on the perimeter of the electrically-conductive layer 20 via printing, etching, sputtering, or vacuum deposition. The region where the electrically-conductive segments 30 are located is covered by the frame of the touch panel, and the rest of the touch panel is the touch-operation area.

Figure 3:
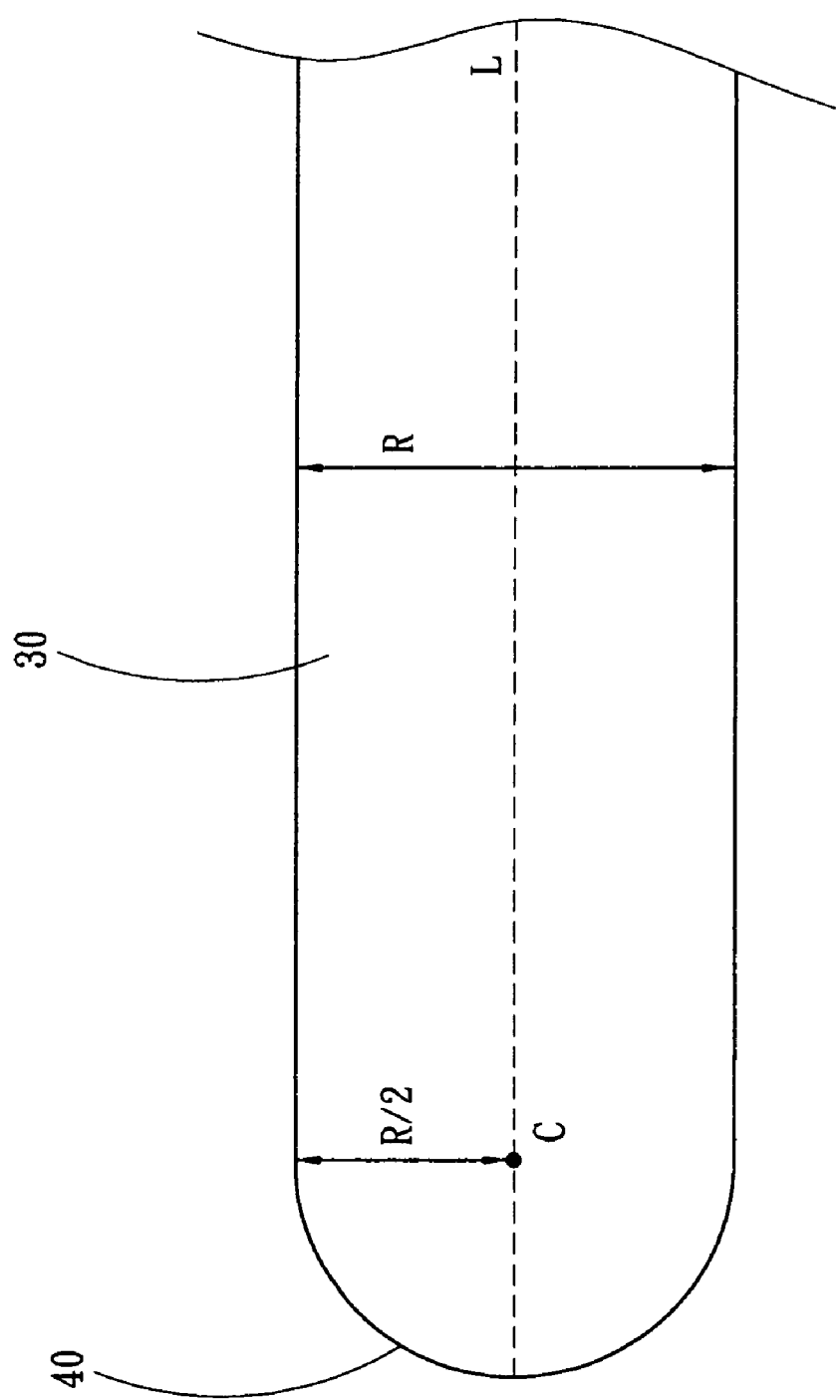
FIG. 3 is a diagram schematically showing the electrically-conductive segment of a capacitive touch panel according to one embodiment of the present invention.
Figure 4A:
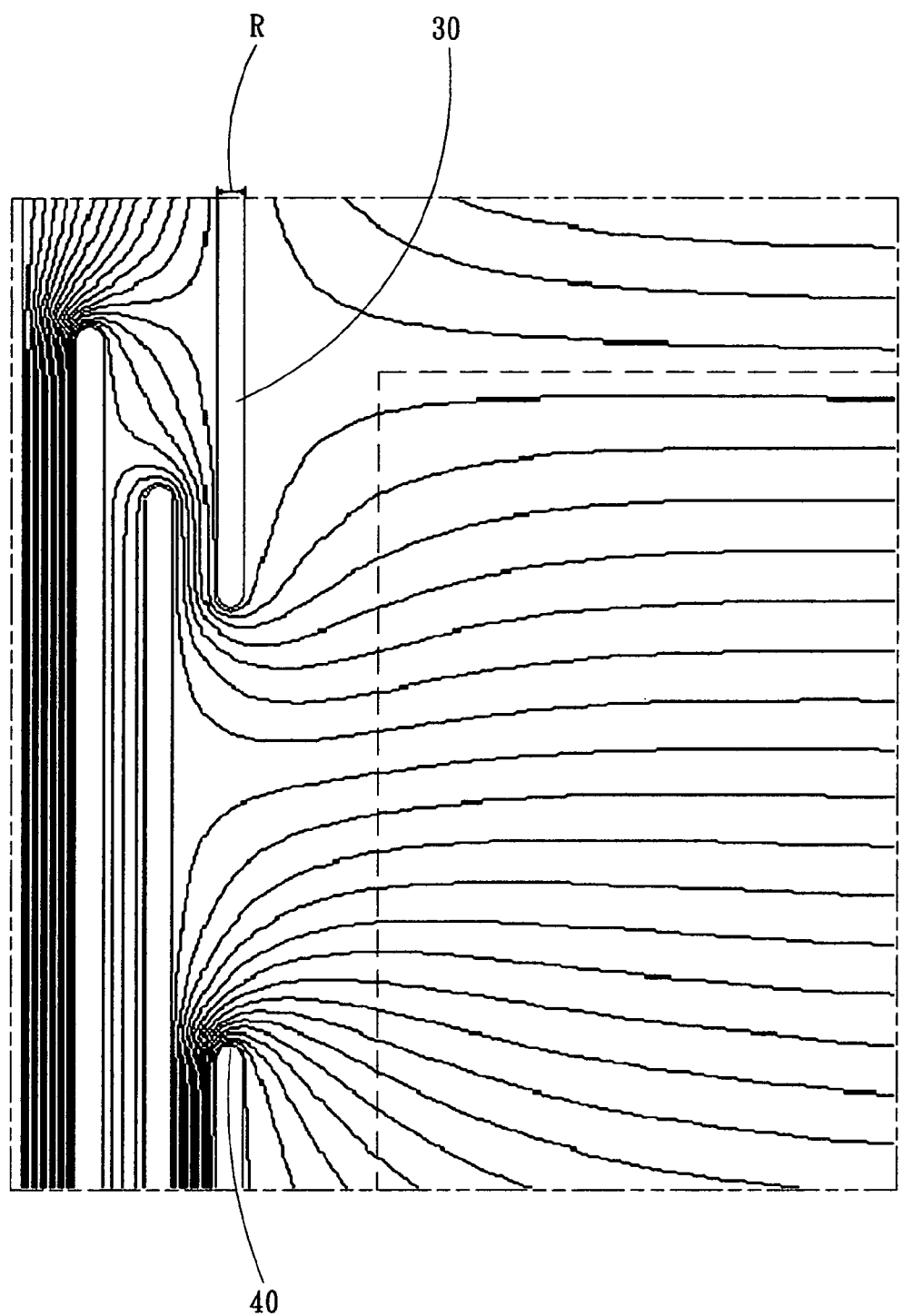
FIG. 4A is a diagram schematically showing the distribution of the electric field lines created by a capacitive touch panel according to one embodiment of the present invention.
Figure 4B:
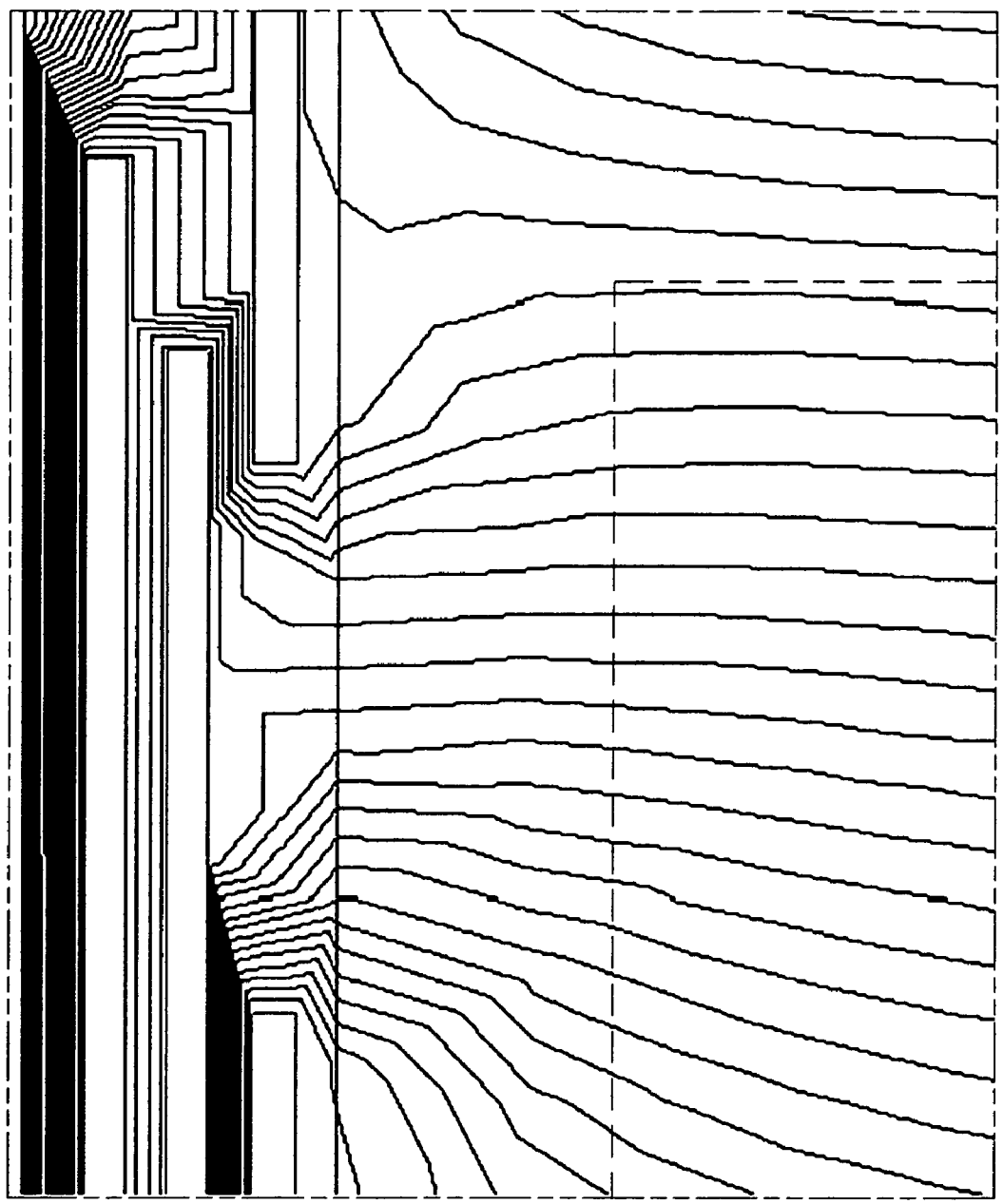
FIG. 4B is a diagram schematically showing the distribution of the electric field lines created by a conventional touch panel.

Refer to FIG. 3. In this embodiment, one end of each electrically-conductive segment 30 has a chamfer 40. In comparison with the conventional electrically-conductive segments that has a rectangular end and non-uniform charge distribution, the end of the electrically-conductive segments 30 of the present invention has a more uniform charge distribution because the chamfer 40 has a smooth contour. In the present invention, the smooth chamfer 40 results in a smooth variation of the electrical field; thus, the electric field lines neighboring the frame will not change abruptly. Refer to FIG. 4A and FIG. 4B diagrams respectively showing the distributions of the electric field lines of the electrically-conductive segments of the present invention and the conventional technology. As shown in FIG. 4A, the electrically-conductive segments 30 of the present invention have the chamfers 40; therefore, the electric field lines are distributed more uniformly, and the electrical field has a better linearity, and the linear region (the region enclosed by dashed-lines) is larger; thus, the required frame area can be smaller, and the touch-operation region of the touch panel can be enlarged. However, as in FIG. 4B, the electrically-conductive segments of the conventional technology have rectangular ends; therefore, the electric field lines are not distributed so uniformly, and the electrical field has a worse linearity, and the linear region (the region enclosed by dashed-lines) is smaller; thus, the required frame area is larger, and the touch-operation region of the touch panel is reduced.

Figure 5:
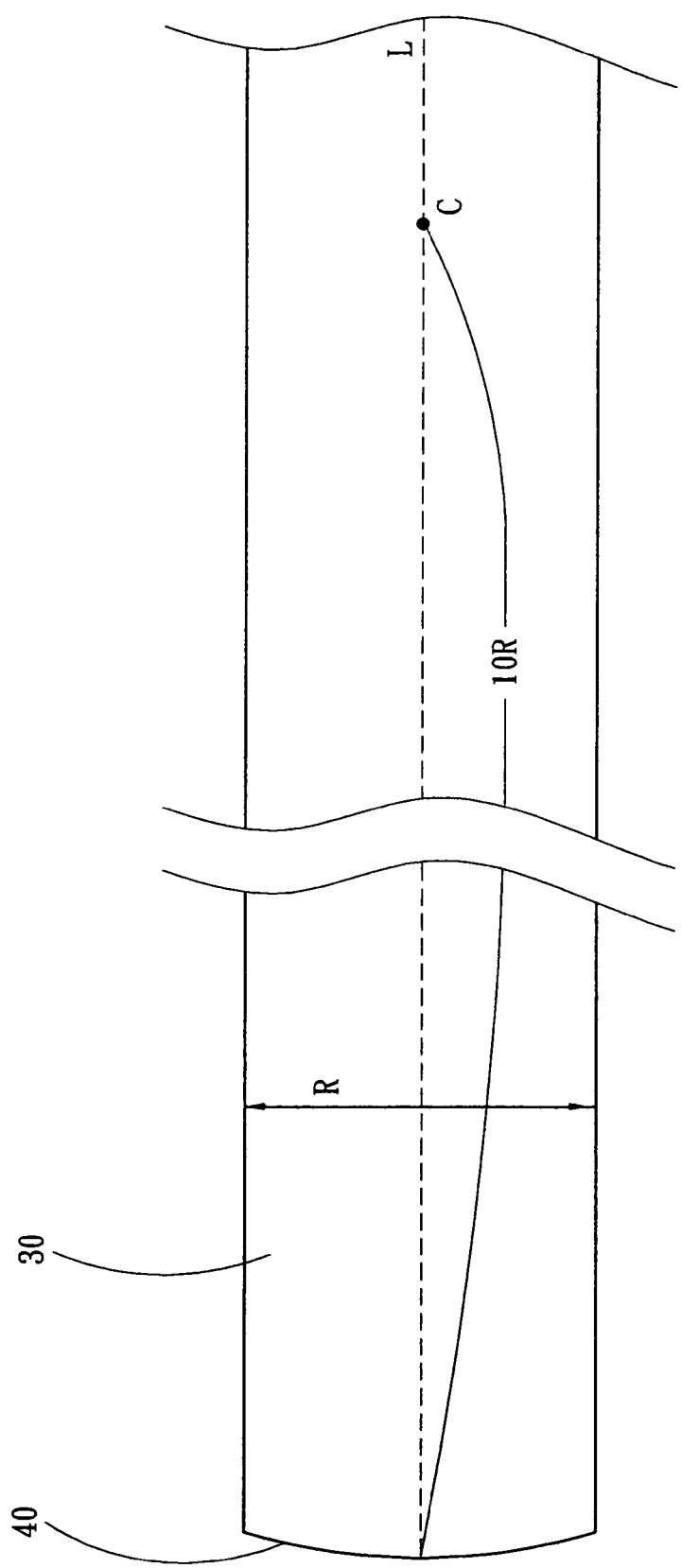
FIG. 5 is a diagram schematically showing the electrically-conductive segment of a capacitive touch panel according to another preferred embodiment of the present invention.

Refer to FIG. 3 again. In this embodiment, the center C of the chamfer 40 is located at the centerline L along the major axis of the electrically-conductive segments 30; the width of the electrically-conductive segments 30 is R, and the curvature radius of the chamfer 40 is R/2. However, the curvature radius of the chamfer 40 is not limited to that shown in FIG. 3. Refer to FIG. 5. In this diagram, the center C of the chamfer 40 is also located at the centerline L along the major axis of the electrically-conductive segment 30; however, the center C of the chamfer 40 is far away from the segment end because the curvature radius of the chamfer 40 is 10R. Briefly speaking, in this preferred embodiment, the center C of the chamfer 40 is located at the centerline L along the major axis of the electrically-conductive segment 30, and the curvature radius of the chamfer 40 ranges from R/2 to 10R. Thus, the single chamfer 40 of the electrically-conductive segment 30 results in that charges at the end of the electrically-conductive segments 30 are uniformly distributed, and the electrical field has a superior linearity.

Figure 6:
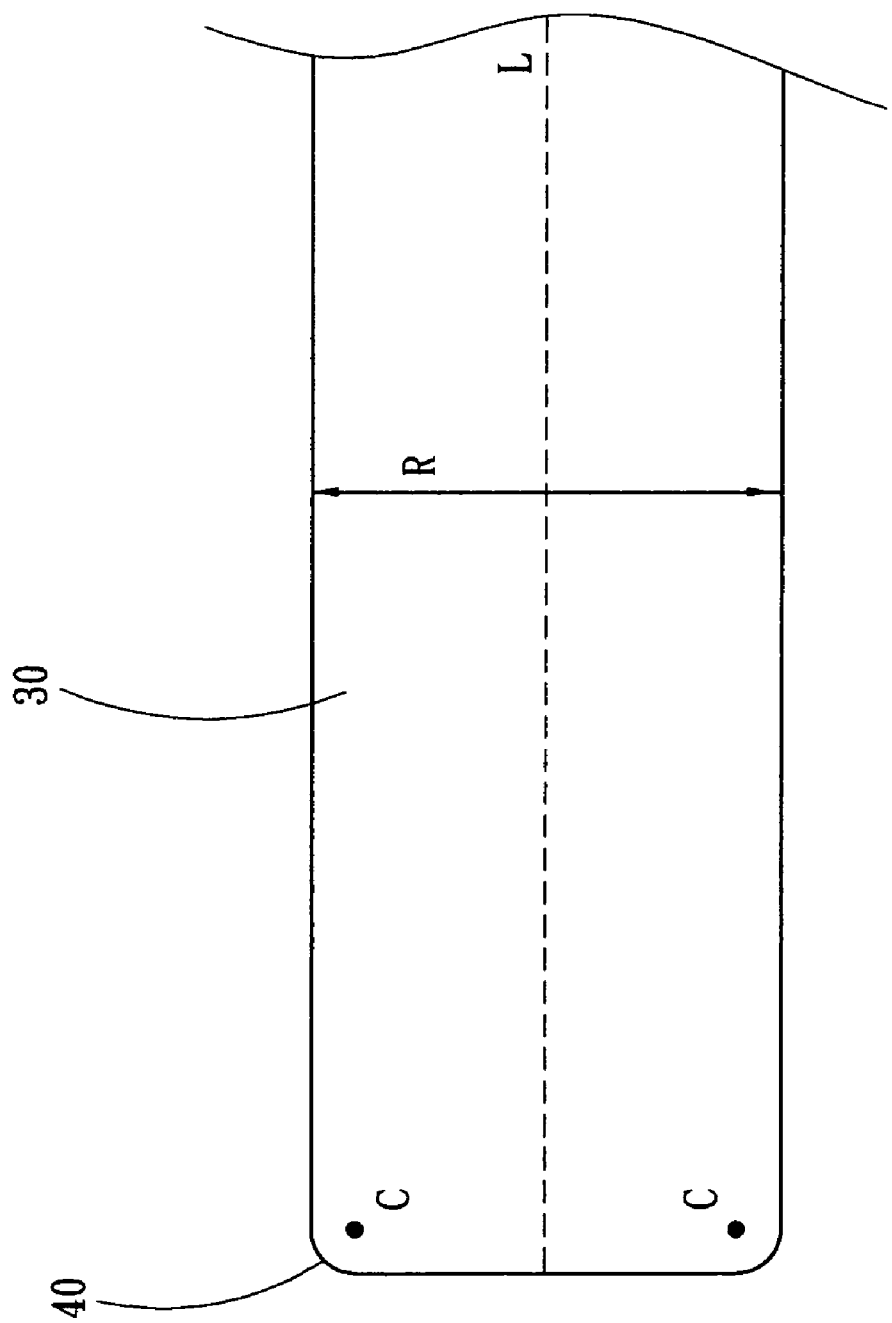
FIG. 6 is a diagram schematically showing the electrically-conductive segment of a capacitive touch panel according to yet another preferred embodiment of the present invention.
Figure 7:
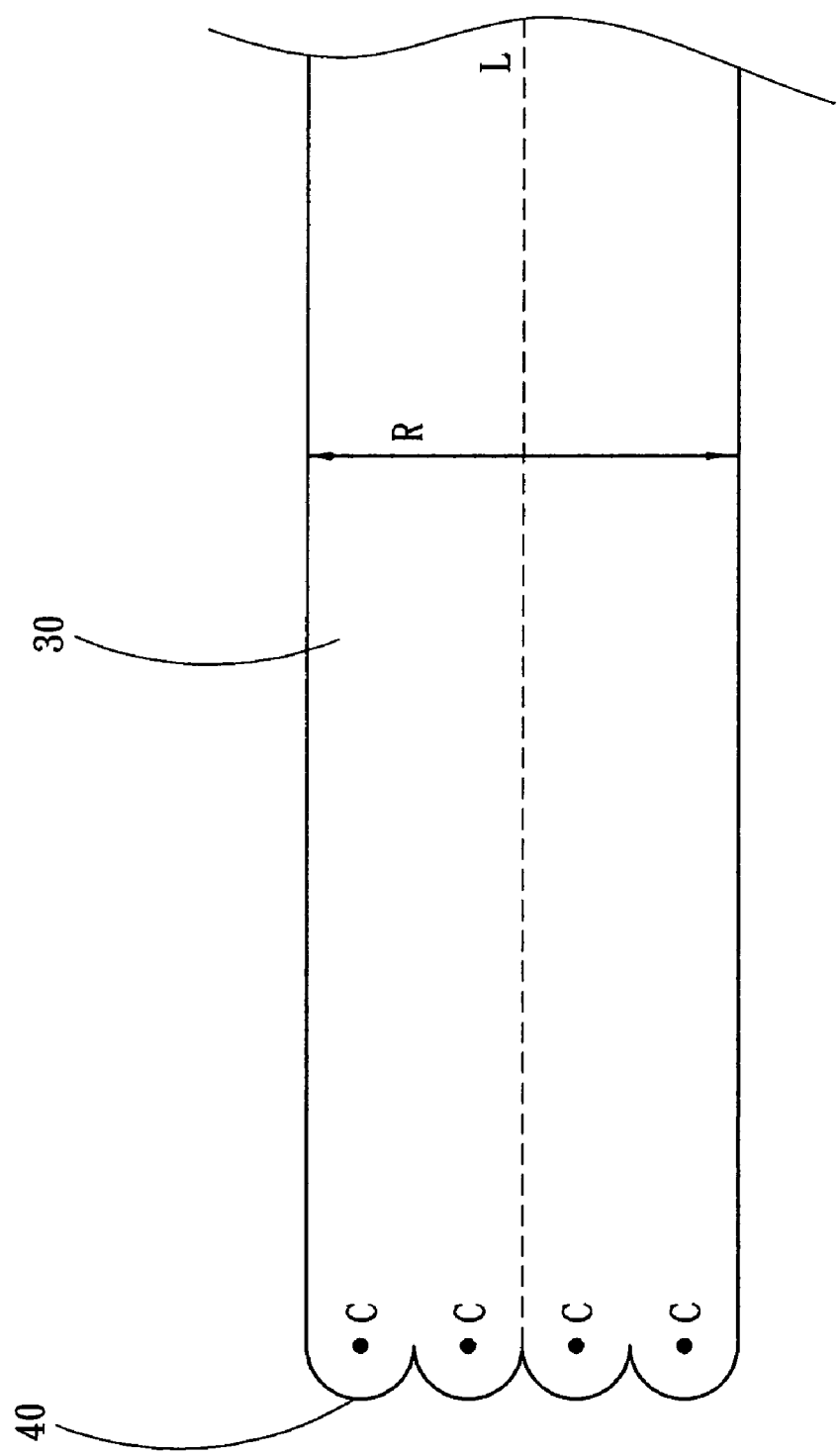
FIG. 7 is a diagram schematically showing the electrically-conductive segment of a capacitive touch panel according to still another preferred embodiment of the present invention.
Figure 8:
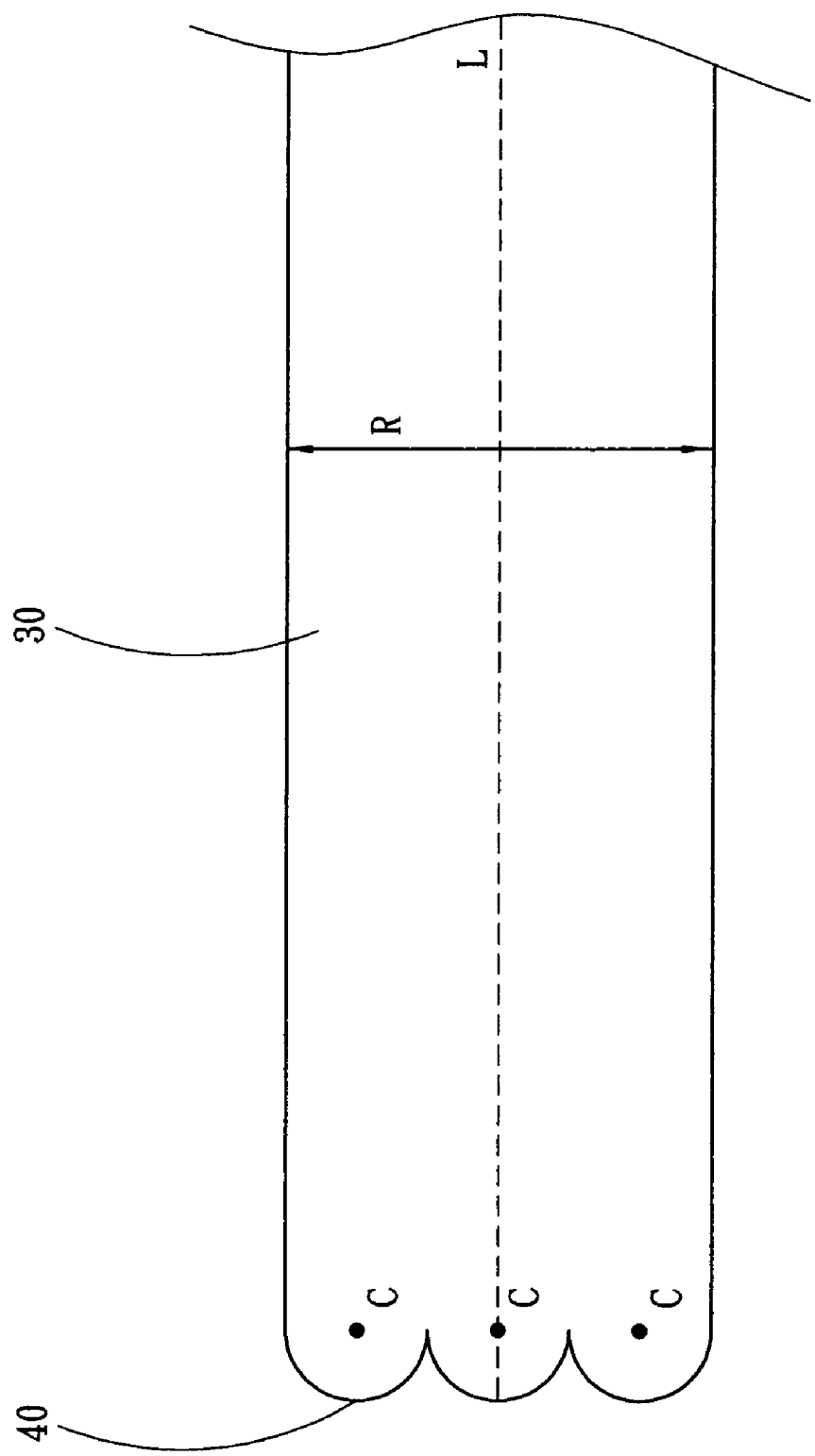
FIG. 8 is a diagram schematically showing the electrically-conductive segment of a capacitive touch panel according to further another preferred embodiment of the present invention.
Figure 9:
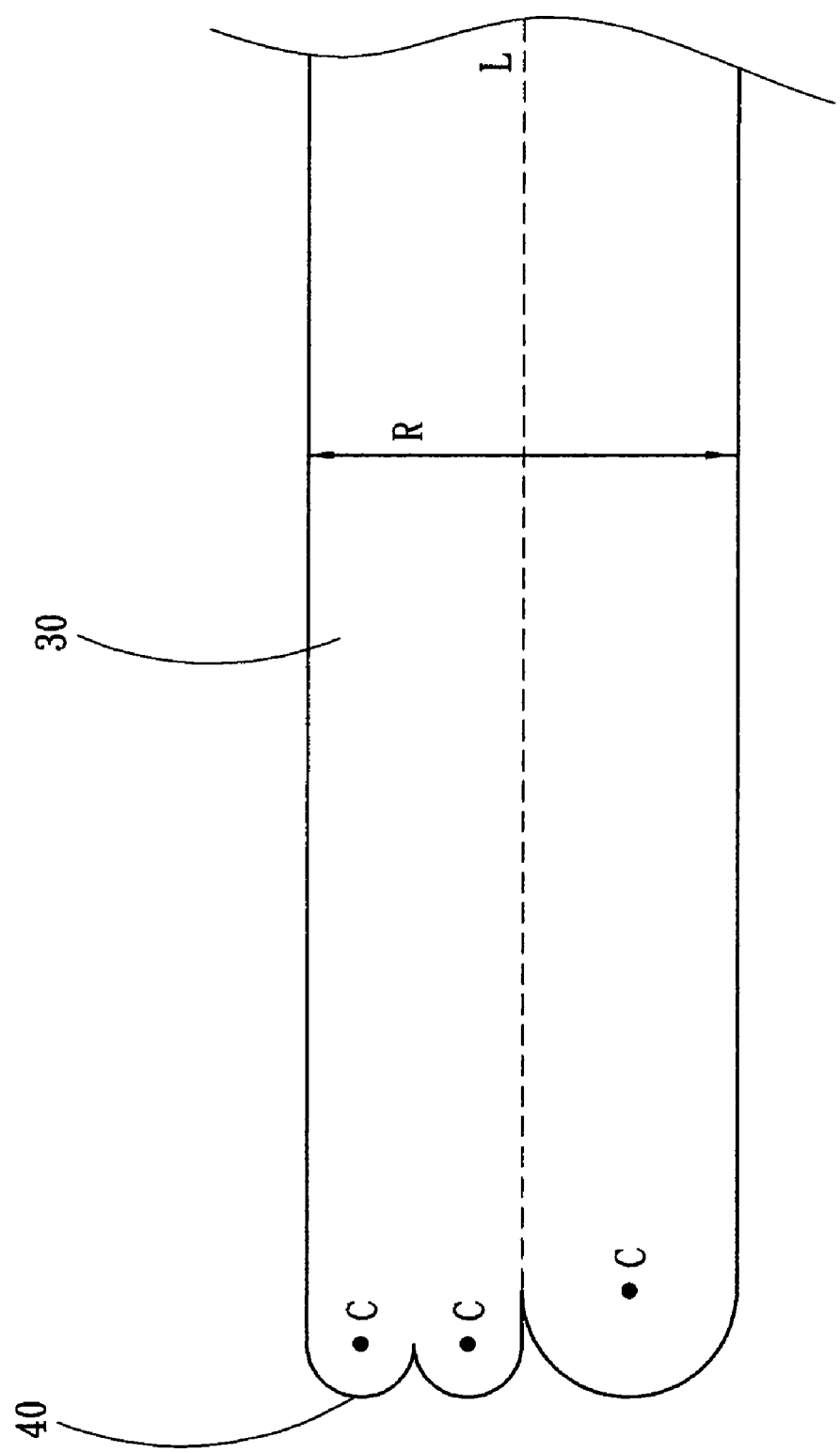
FIG. 9 is a diagram schematically showing the electrically-conductive segment of a capacitive touch panel according to further another preferred embodiment of the present invention.

Refer to FIG. 6 to FIG. 8. In the present invention, the number of the chamfer 40 is not limited to be single (as shown in FIG. 3 and FIG. 5) but may be plural. The number of the chamfers 40 may be even (as shown in FIG. 6 and FIG. 7) or odd (as shown in FIG. 8). In this preferred embodiment, the curvature radius of the chamfer 40 ranges from R/10 to 10R, and the centers C of the chamfers 40 are not necessarily all located at the centerline L along the major axis of the electrically-conductive segment 30. In this preferred embodiment, the positions of multiple chamfers 40 are symmetrical with respect to the centerline L along the major axis of the electrically-conductive segment 30 so that the distribution of electric field lines can be more uniform and coherent. As shown in FIG. 9, in another preferred embodiment, the positions of multiple chamfers 40 are unsymmetrical with respect to the centerline L along the major axis of the electrically-conductive segment 30.

In those embodiments of the present invention, as one end of the electrically-conductive segment 30 has one or multiple chamfers 40, the configuration of electric field lines will not change abruptly, and the linearity of electrical filed is also better. Therefore, when a finger or a pen point contacts the touch panel, the X-coordinate and Y-coordinate of the contact point can be more precisely defined, and the correctness of the instruction created by the touch operation is also promoted.

In summary, the present invention proposes a capacitive touch panel, wherein one end of the electrically-conductive segment 30 has one or multiple chamfers 40; the user's contact on the capacitive touch panel of the present invention can create an electrical field of superior linearity and electric field lines with smooth variation; thereby, the correctness of touch operation can be promoted, and the usable area of the touch panel can be enlarged.

The present invention has been clarified via the preferred embodiments described above; however, it is not intended to limit the scope of the present invention. Any equivalent modification and variation according to the spirit of the present invention is to be also included within the scope of the present invention.

What is claimed is:
1. A capacitive touch panel, comprising:
an insulation substrate;
an electrically-conductive layer, installed on said insulation substrate;
multiple electrically-conductive segments, installed on said electrically-conductive layer, with one end of each of said electrically-conductive segment having a chamfer and the center of said chamfer located at the centerline along the major axis of said electrically-conductive segment; and
wherein the width of each of said electrically-conductive segments is R, and the curvature radius of said chamfers is within the range from R/2 to 10R.
2. A capacitive touch panel, comprising:
an insulation substrate;
an electrically-conductive layer, installed on said insulation substrate;
multiple electrically-conductive segments, installed on said electrically-conductive layer, with one end of each said electrically-conductive segment having a chamfer; and
wherein the width of said electrically-conductive segments is R, and the curvature radius of said chamfer is within the range from R/10 to 10R.
3. The capacitive touch panel according to claim 2, wherein one end of each of said electrically-conductive segment may have multiple chafers.
4. The capacitive touch panel according to claim 3, wherein the positions of said chamfers are symmetrical with respect to the centerline along the major axis of said electrically-conductive segment.
5. The capacitive touch panel according to claim 3, wherein the positions of said chamfers are unsymmetrical with respect to the centerline along the major axis of said electrically-conductive segment.

* * * * *